US010691364B2

(12) United States Patent
Jahn et al.

(10) Patent No.: US 10,691,364 B2
(45) Date of Patent: Jun. 23, 2020

(54) METHOD FOR EXCHANGING DATA BETWEEN ENGINEERING TOOLS OF AN ENGINEERING SYSTEM, AND ENGINEERING SYSTEM FOR CARRYING OUT THE METHOD

(71) Applicant: SCHNEIDER ELECTRIC INDUSTRIES SAS, Rueil-Malmaison (FR)

(72) Inventors: Herwig Jahn, Mainhausen (DE); Deepak Devaraja, Bengaluru (IN)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 93 days.

(21) Appl. No.: 16/059,284

(22) Filed: Aug. 9, 2018

(65) Prior Publication Data
US 2019/0196737 A1 Jun. 27, 2019

(30) Foreign Application Priority Data
Aug. 11, 2017 (EP) ..................... 17186018

(51) Int. Cl.
*G06F 9/54* (2006.01)
*G06F 3/06* (2006.01)
(Continued)

(52) U.S. Cl.
CPC .......... *G06F 3/0647* (2013.01); *G06F 3/0604* (2013.01); *G06F 3/0659* (2013.01);
(Continued)

(58) Field of Classification Search
CPC ..................................... G06F 9/544
(Continued)

(56) References Cited

U.S. PATENT DOCUMENTS

2006/0259909 A1* 11/2006 Passero .................. G06F 9/541
719/312
2015/0317128 A1 11/2015 Baughman

FOREIGN PATENT DOCUMENTS

WO 2008/035372 A1 11/2008
WO 2012/066846 A1 5/2012

* cited by examiner

*Primary Examiner* — Andy Ho
(74) *Attorney, Agent, or Firm* — Ladas & Parry LLP; Malcolm J. MacDonald

(57) ABSTRACT

The invention relates to a method for the exchange of engineering data (RED) between independent engineering tools (ET1 . . . ETx) of an engineering system (ESY) and to an engineering system, wherein engineering data (ET1PD . . . ETxPD) of each of the engineering tools (ET1 . . . ETx), which is associated with a project such as a production system, a switching system or a robot cell, is stored in a tool-specific data format in a data memory (SR, SPMR) associated with the engineering tool, and wherein user-selected engineering data (ET1D . . . ETxD) of the engineering tools, which is associated with a system function (SF1 . . . SFn) such as a project management function, a topology management function, a variable exchange function or a diagnosis function and which is of interest for at least an additional one of the engineering tools, is converted by means of a converting unit (ETC1 . . . ETCx) into a standardized data format and is stored in a standardized common data memory (CC). In order to optimize the exchange of engineering data at engineering time and in order to achieve minimal redundancy without change of the existing data models of the engineering tools, it is provided that changes of the selected engineering data (ET1D . . . ETxD) of the individual engineering tools (ET1D . . . ETxD), which is associated with a system function (SF1 . . . SFn), are continuously cached in the standardized (Continued)

Figure 1:
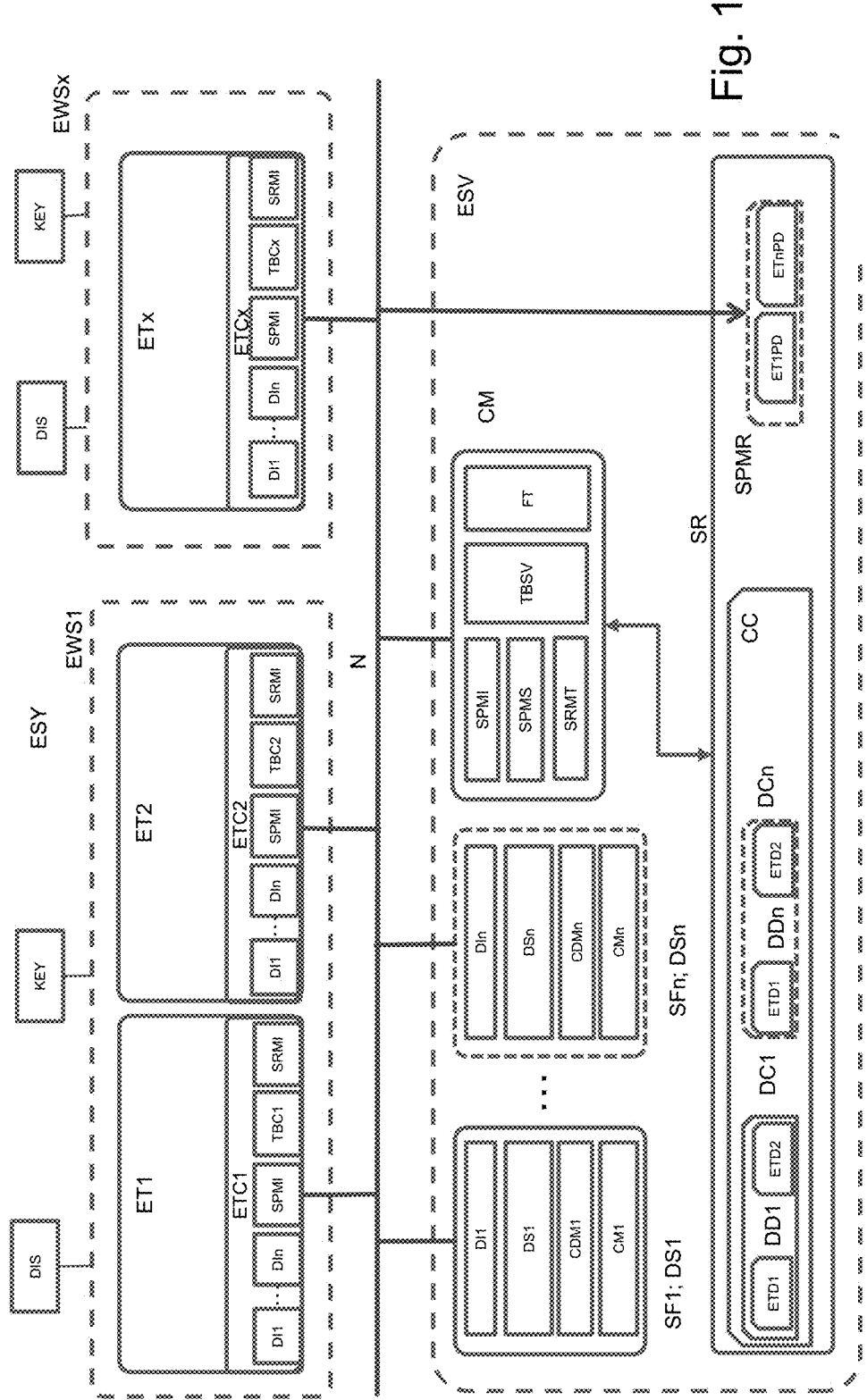

common data memory (CC) and are read as needed at any time by one of the engineering tools (ET1 ... ETx), and that, for a temporary access to all the engineering data (ET1PD ... ET1XPD) associated with the project by a requesting engineering tool, a start of the providing engineering tool is carried out.

10 Claims, 10 Drawing Sheets

(51) Int. Cl.
    *G06Q 10/06*     (2012.01)
    *G06F 30/00*     (2020.01)

(52) U.S. Cl.
    CPC ............ *G06F 3/0683* (2013.01); *G06F 9/544* (2013.01); *G06F 30/00* (2020.01); *G06Q 10/06* (2013.01)

(58) Field of Classification Search
    USPC ........................................................ 719/312
    See application file for complete search history.

METHOD FOR EXCHANGING DATA BETWEEN ENGINEERING TOOLS OF AN ENGINEERING SYSTEM, AND ENGINEERING SYSTEM FOR CARRYING OUT THE METHOD

The invention relates to a method for the exchange of engineering data between independent engineering tools of an engineering system, wherein engineering data of each of the engineering tools, which is associated with a project such as a production system, a switching system or a robot cell is stored in a tool-specific data format in a data memory associated with the engineering tool, and wherein user-selected engineering data of the engineering tools, which is associated with a system function such as a project management function, a topology management function, a variable exchange function or a diagnosis function and which is of interest for at least an additional one of the engineering tools, is converted by means of a converting unit into a standardized data format and is stored in a standardized common data memory, wherein changes of the selected engineering data of the engineering tools, which is associated with a system function, are continuously cached in the standardized common data memory and is read as needed at any time by one of the engineering tools.

Furthermore, the invention relates to an engineering system for the exchange of engineering data between independent engineering tools of an engineering system, wherein engineering data associated with a project such as a production system, a switching system or a robot cell is stored in a tool-specific data format in a data memory associated with the engineering tool, and wherein user-selected engineering data of the engineering tools, which is associated with a system function such as a project management function, a topology management function, a variable exchange function or a diagnosis function and which is of interest for at least an additional one of the engineering tools, is converted by means of a converting unit into a standardized data format and is stored in a standardized common data memory, memory, wherein the system functions are designed as domain services with a common standardized data model, wherein changes of the selected engineering data of the individual engineering tools, which is associated with the system function, are continuously cached by means of the domain services in a standardized common data memory and can be read as needed at any time by one of the engineering tools.

WO 2008/135372 A1 relates to a method and to a system design system for creating system-specific data. A technical system is constructed from partial systems interacting with one another. Engineering tools of the partial systems yield specific data of the respective partial systems and can request specific data from other partial systems. The method includes the steps:
converting the specific data characterizing a respective partial system into a defined data format;
transmitting the specific data to a server device;
storing the specific data by means of the server device;
wherein a respective engineering tool sends a change or updating request to a server device for updating or changing specific data of a partial system.

US 2015/0317128 A1 relates to a device for managing the data exchange between tools for several products in a production line. The device includes an application starter which is designed to generate a workspace for the support of a plurality of applications. The device also includes an application manager which is designed to work as a web service and to copy first data and second data coupled to the first application into the work area. The device moreover includes a service for concurrent engineering data, which is designed to acquire data types associated with the first data and the second data in order to eliminate differences in the data types, wherein the data types comprise at least "strings," "doubles" and "integers." The device also includes a service for storing data and for retrieving data which is designed to enforce data integrity.

WO 2012/066846 A1 relates to a method and to an engineering system, wherein all the engineering data of a first engineering tool of interest for a second engineering tool is identified, configured and stored in an electronic data container. The electronic data container can preferably be a data file or a database. Each data element stored in the electronic data container is provided with a link to the original data as well as with a "snapshot copy" of this data. The electronic data container with this data is opened and displayed by the target engineering tool or a separate application, whereby a read-only display of the imported data is provided in the target engineering tool and whereby the importing of the engineering data is enabled.

In the known methods, data files with selected engineering data is exchanged between two engineering tools. However, this type of data exchange is not efficient due to the requirements of permanent file backup, of updating of the data files and of reading operations. Furthermore, it is difficult to keep the engineering data consistent.

Moreover, from the prior art, methods are known whereby engineering tools are connected directly to one another via interfaces. However, these methods exhibit high complexity in order to control the individual connections between the engineering tools and to manage the consistency of the engineering data. Independently thereof, the engineering tool providing the data must always be in operation.

A more systematic classical approach with a central data bank is normally ruled out, since the conversion of all the tool data to the common database would entail unacceptable modification efforts in the tools. Alternatively, the simultaneous maintaining of engineering tool projects and databases would bring about difficulties with the consistency of the engineering data. In addition, in many cases, an event-related direct data connection from a first engineering tool to a second engineering tool is more efficient than storing all the engineering data in a database. Event-related direct data transmission means that data is transmitted only when the data is actually needed in the second engineering tool and not in general with each updating within the first engineering tool.

Usually, engineering data is stored in a non-standardized format, whereby a conversion of the engineering data is necessary in the case of a transmission from one engineering tool to another engineering tool.

According to the prior art, the engineering data can be accessed only if the corresponding engineering tool is in operation.

According to the prior art, information must be duplicated manually into several tool projects, for example, variable definitions, IP addresses, device descriptions or graphic symbols, resulting in the risk that the data is no longer consistent. Consequently, there is a desire for standardized data formats which are supported by all engineering tools. However, this results in additional storage of the duplicated data. Although data duplication cannot be entirely avoided, it should be minimized.

Therefore, the underlying aim of the present invention is to develop a method and an engineering system for carrying out the method of the type mentioned at the start, so that the exchange of engineering data at engineering time is optimized and minimal redundancy is achieved without change of the existing data models of the engineering tools.

The aim is achieved according to the invention in that the engineering data relating to a project and/or the data of an engineering tool relating to a system function, after separation of the engineering tool, is stored in a common data memory, and in that, for temporary access to all the project-associated engineering data by a requesting engineering tool, a start of the separated engineering tools providing the data or a start of the data server providing the data is carried out.

According to a preferred procedure, it is provided that the caching is carried out according to a caching strategy, wherein the engineering data is cached in accordance with a data classification comprising:

Class 1 data which is cached and updated, so that it can be accessed at any time without the associated engineering tool being in operation, Class 2 data which is partially cached, wherein the associated engineering tool ensures full access to all the data associated with a project, Class 3 data which is not cached but available via the providing engineering tool, and Class 0 data which is not transformed into the common data model and which is read exclusively via a specific interface (SPMI) of the engineering tool (ET1 . . . ETx).

A main feature of the present invention is the collaboration of engineering tools in combination with a caching strategy for engineering data to be exchanged and a start strategy for the engineering tools.

In comparison to the prior art, the method according to the invention is characterized in that an efficient exchange of data between a plurality of engineering tools is possible, without having to change the engineering tools and/or the data formats of the engineering tools.

Since only a fraction of all the data managed by an engineering tool is relevant for the exchange, it is sufficient to standardize only this portion and make it accessible to each tool. Thus, the effort to be made for the interfaces, for conversion routines and for the data duplication is limited.

According to the invention, a portion of the engineering data can be provided or requested, even if the requesting engineering tool or the providing engineering tool is not in operation. For the individual engineering tools, it makes no difference whether they access cached engineering data or non-cached engineering data.

Preferably, the system functions of the engineering system are provided in the form of variable management, diagnosis management, firmware management, application management, function management, network management, hardware configuration management, et al. as standardized common domain services, wherein the engineering tools can access the common standardized engineering data via the domain services.

The domain services in each case provide a common standardized data model for the representation of their domain data.

The caching of selected engineering data and/or the start of an engineering tool is preferably carried out taking into consideration data selection criteria, selection statistics, statistical information and/or dynamic information. The data selection criteria are preferably specified by a user, and the selection statistics are preferably prepared by reading at the same time the requested engineering data.

It is provided that the engineering tools communicate with one another via the domain services and with the common standardized data memory.

The conversion of the engineering data in each individual engineering tool is preferably carried out by means of the tool connector.

The engineering system according to the invention is characterized in that the engineering data relating to a project and/or the data of an engineering tool relating to a system function, after separation of the engineering tool, are stored in a common data memory, and in that, for a temporary access to all the engineering data associated with the project by a requesting engineering tool, a start of the separated engineering tool providing the data or of the data service providing the data is carried out by means of a start mechanism.

In order to prevent disturbing the work of the user due to the start of an engineering tool, it is provided that instances of the engineering tools are installed on the engineering server and that the instance of the engineering tool is started on the engineering server in order to access all the data of this engineering tool.

The inventive engineering system comprising the engineering tools and a system tool enables a complete overview of an automation architecture of a production system, production line or machine. The system provides a collaborative environment for all the life cycles of an automation tool including automation tools of third-party providers. In addition, the possibility exists of scaling the software configuration of the system in accordance with the requirements of a user.

The inventive engineering system forms a framework for collaboration of engineering tools in combination with the system functions designed as domain services on the system level. In particular, the common use of data between the engineering tools and the system functions designed as domain services is enabled.

In comparison to engineering systems of the prior art, the inventive system is characterized in that the participation of engineering tools in the engineering system can be scaled. The engineering tools themselves can decide, via the plurality of domain interfaces, on which system functions or domain service they would like to take part in, such as, for example, a project management service, a topology management service, a runtime data exchange definition service, et al. The engineering tools themselves decide on the time at which they would like to take part.

Based on the use of a standardized data model in combination with a data converter for each individual engineering tool, a change of the individual data model of the individual engineering tools is no longer absolutely necessary.

An additional inventive feature is the collaboration between engineering tools on the one hand and the domain services based on data stored in the respective domain memory.

Preferably, the standardized data models are permanently available. The domain interfaces of the individual domain services are designed in order to be able to access data of a certain engineering tool in a targeted manner. The common data model is the sum of all the data that the engineering tool would like to disclose permanently.

In order to be able to temporarily access all the data of one of the engineering tools, the engineering tool can be started via the corresponding tool connector, as is explained below.

The engineering system enables the support of standards such as OPC-UA and AML whose interfaces are then attached to the domain services. It can also be expanded by semantic support features.

Moreover, it should be noted that only the engineering tools needed by the user for accomplishing his task have to be installed, although the advantages of a complete data exchange continue to apply as long as a collaborative engineering tool is installed in the system. This results in advantages such as scalability, conversion capability, and reduced complexity. In particular, a dedicated costly server with a large working memory and hard disk memory and high efficiency is not absolutely necessary, so that less efficient laptops already in use can continue to be used.

An essential feature according to the invention which must be emphasized is that the consistently up-to-date buffered standardized data model is accessible at any time for the engineering tools via the domain services.

By means of the inventive implementation strategy, it is ensured that the standardized data model is available at all times. The result is a balance between the persistence of redundant data and the availability of engineering tools.

Furthermore, mechanisms for data retrieval are provided, in order to be able to access old data, after the separation of one of the engineering tools, from the common data memory.

By means of the domain interfaces, the data converters for converting a specific data model of the engineering tool into a standardized data model are made available.

In comparison to the prior art, the inventive engineering system follows a new approach, namely away from complex integrated engineering tools and toward distributed scalable functions.

Additional details, advantages and features of the invention result not only from the claims, the features that can be obtained therefrom—separately and/or in combination—but also from the following description of a preferred embodiment example which can be obtained from the drawings.

Figure 2:
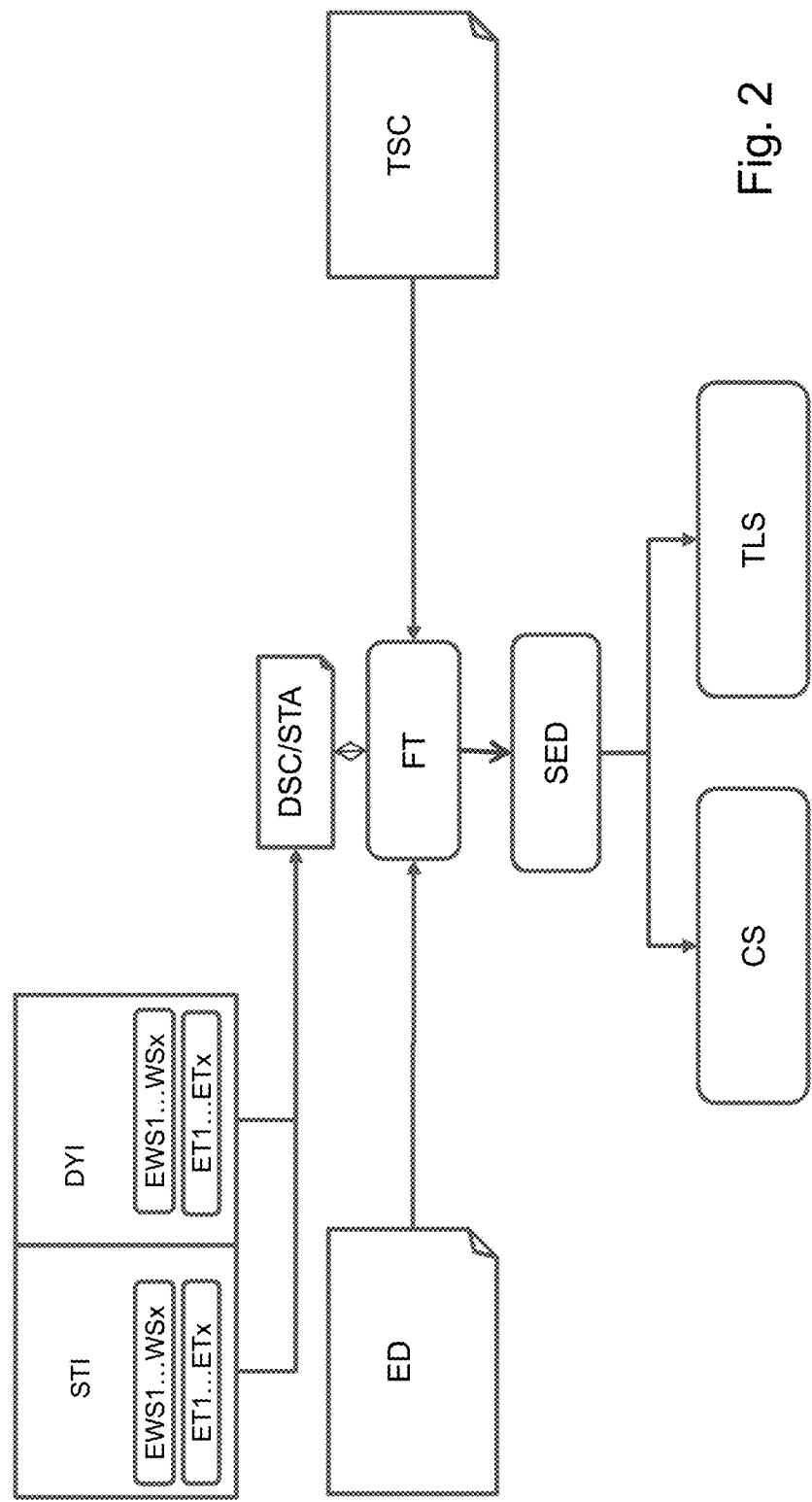
Figure 3:
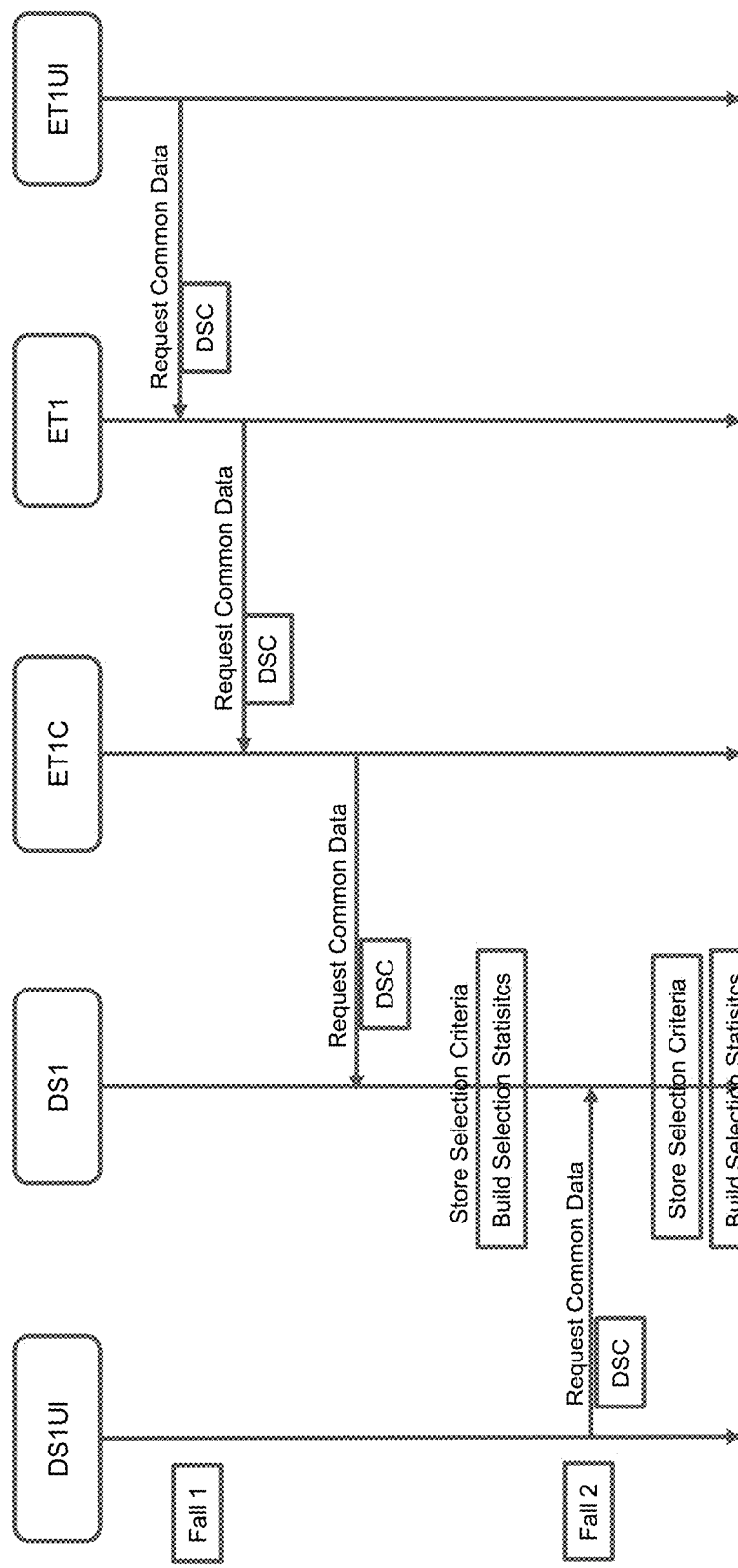
Figure 4:
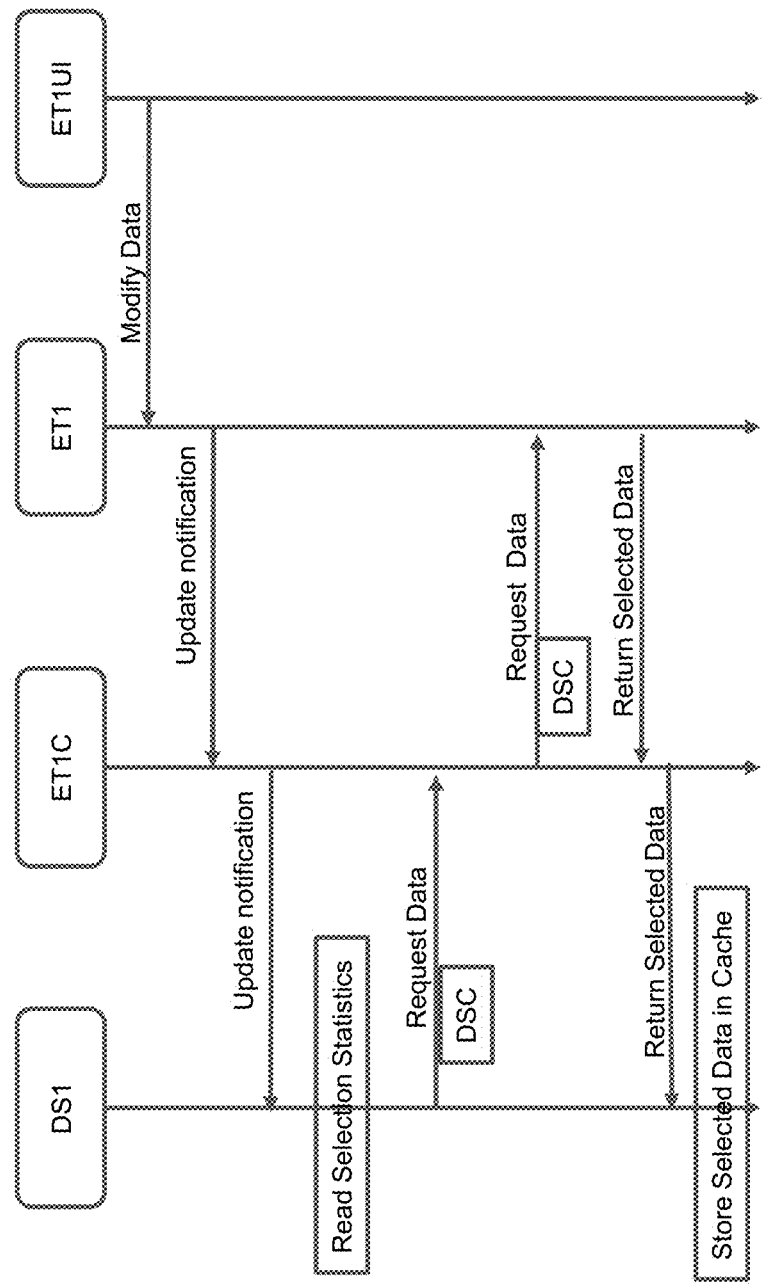
Figure 5:
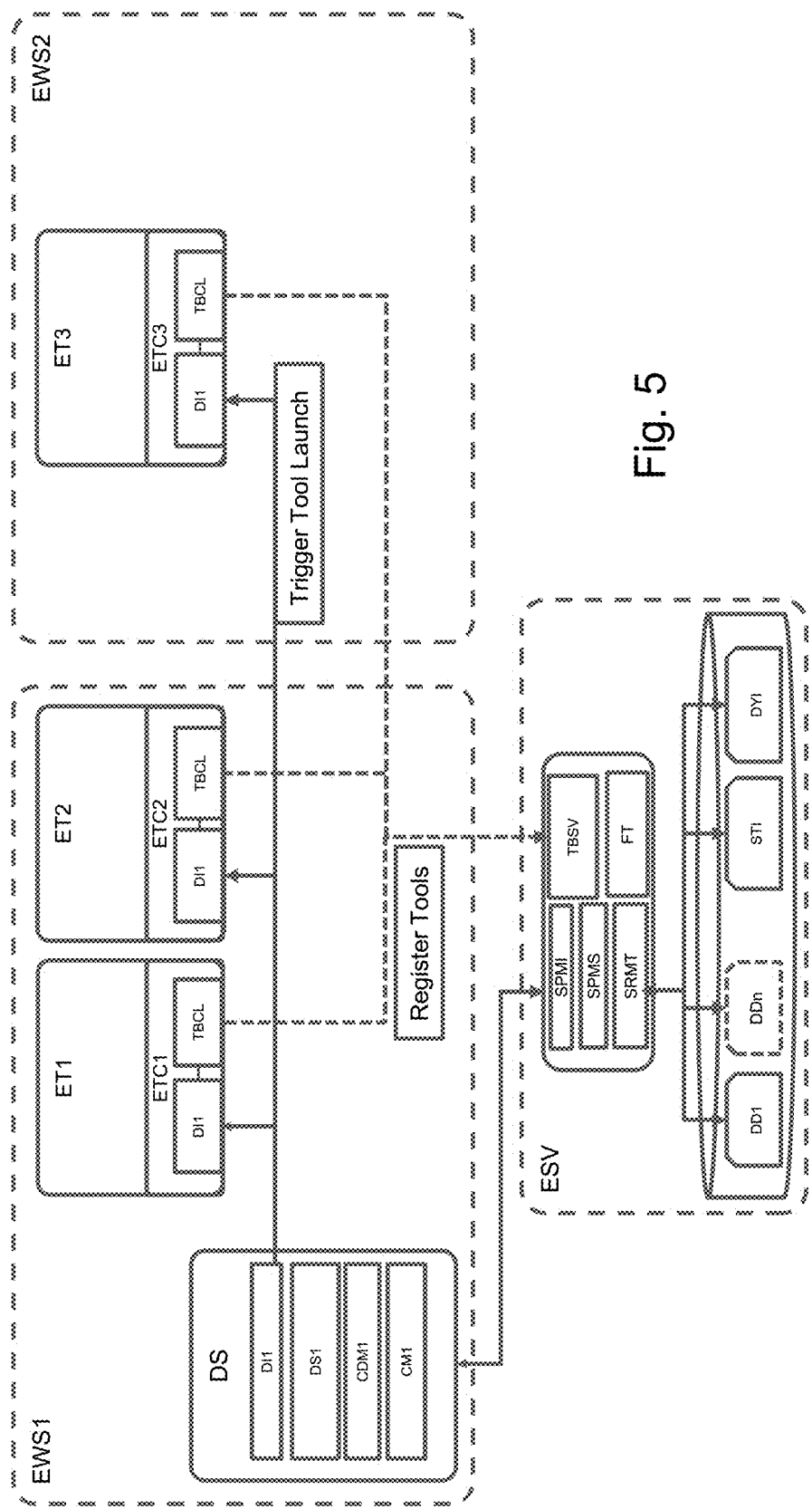
Figure 6:
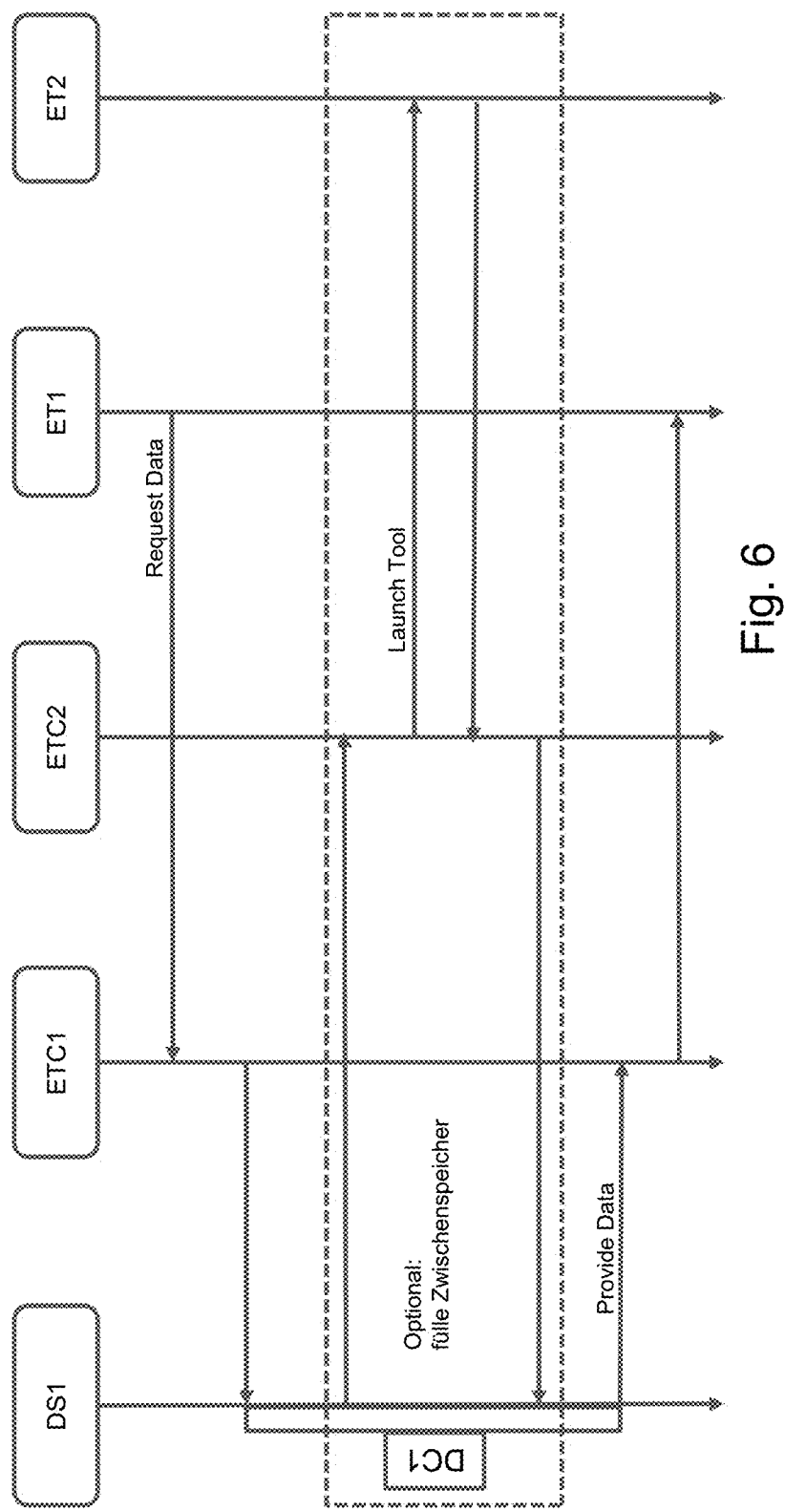
Figure 7:
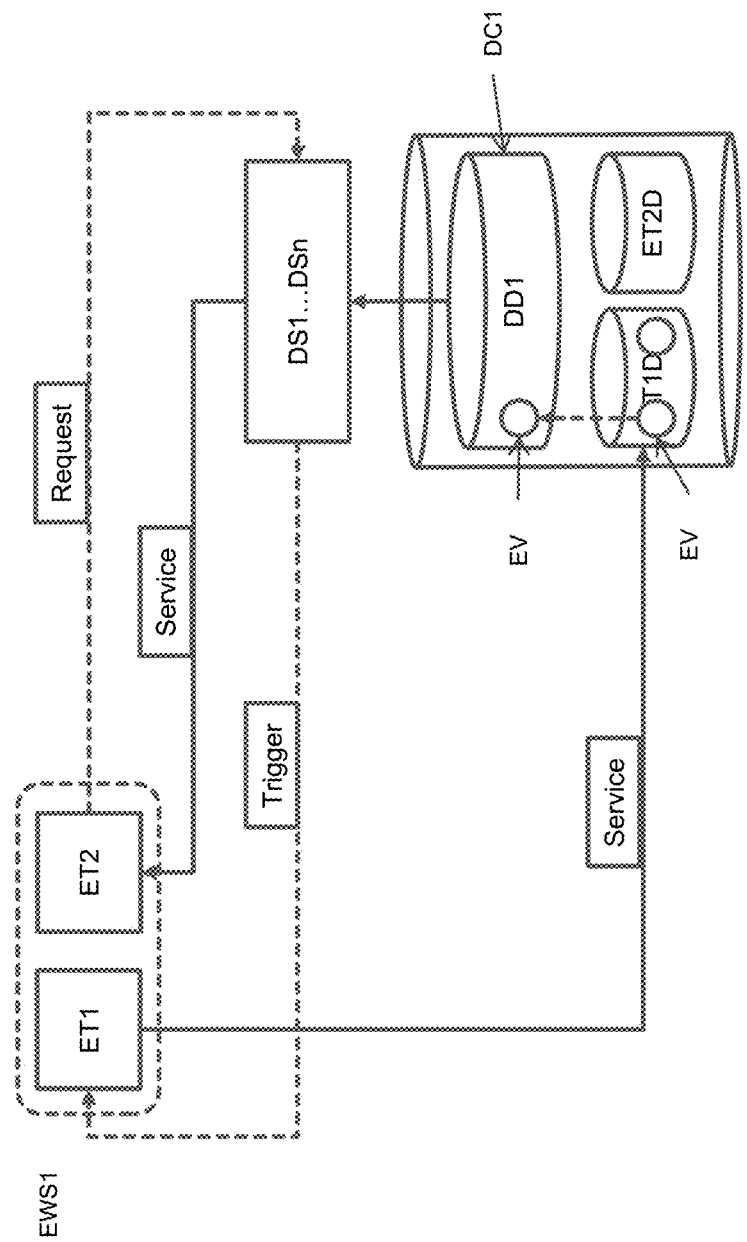
Figure 8:
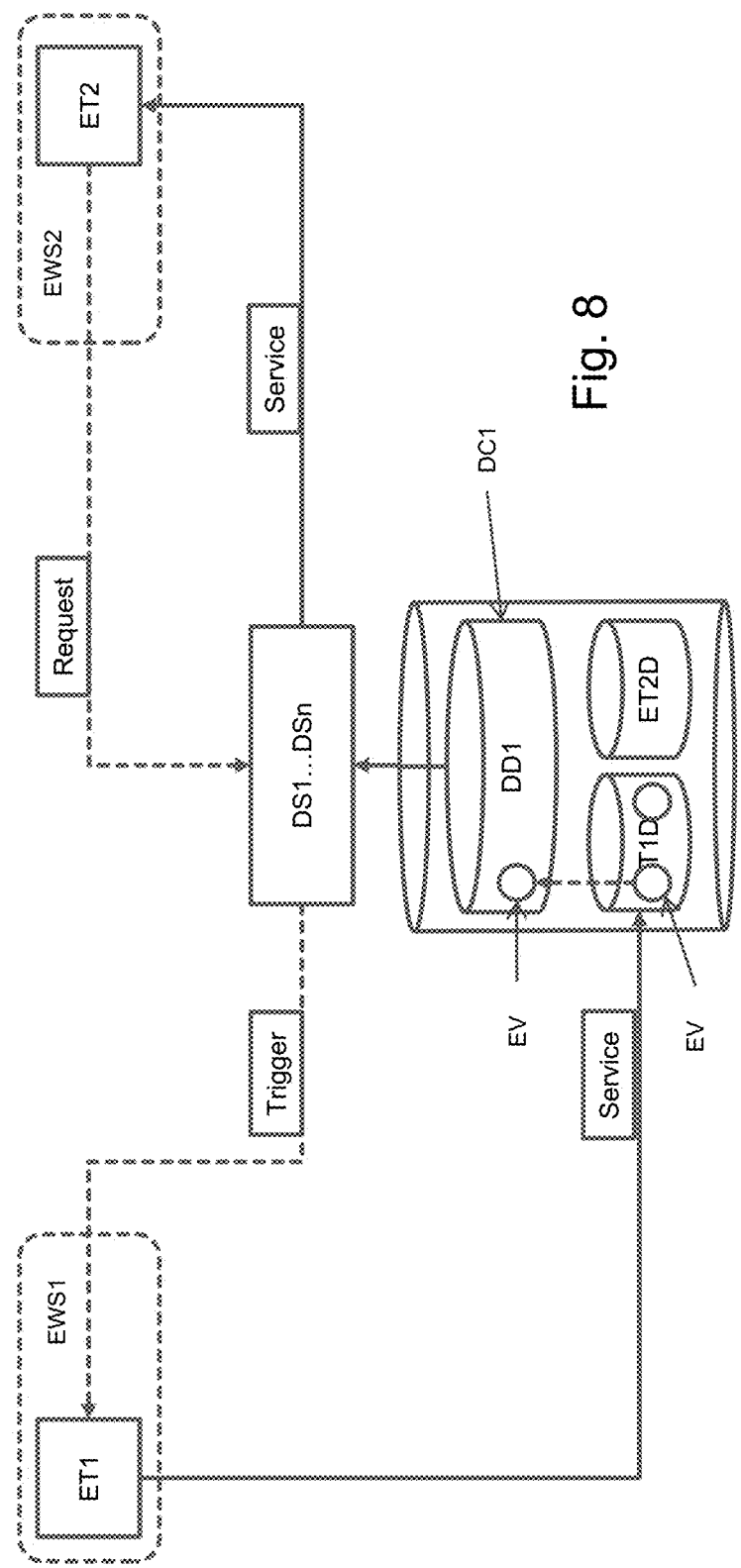
Figure 9:
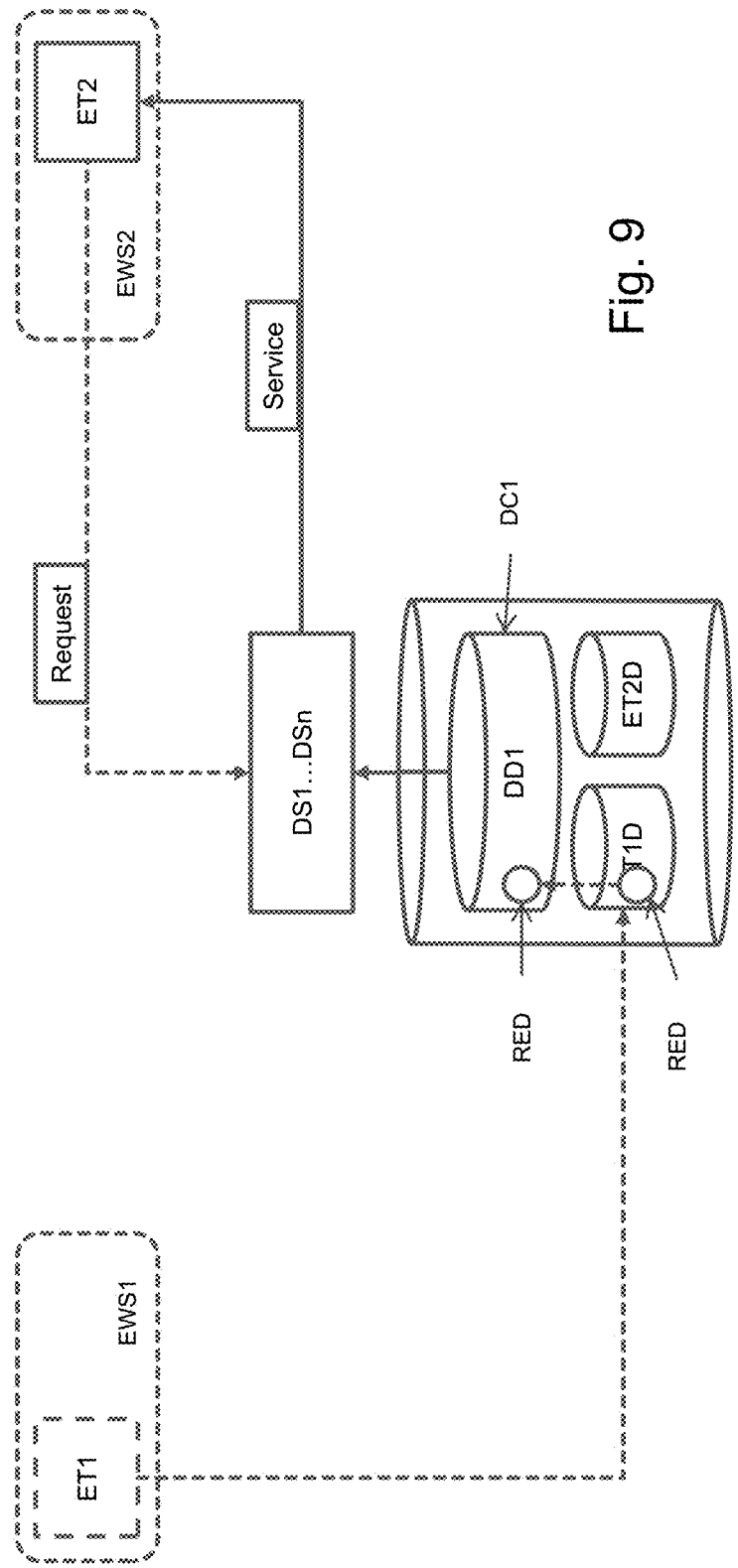
Figure 10:
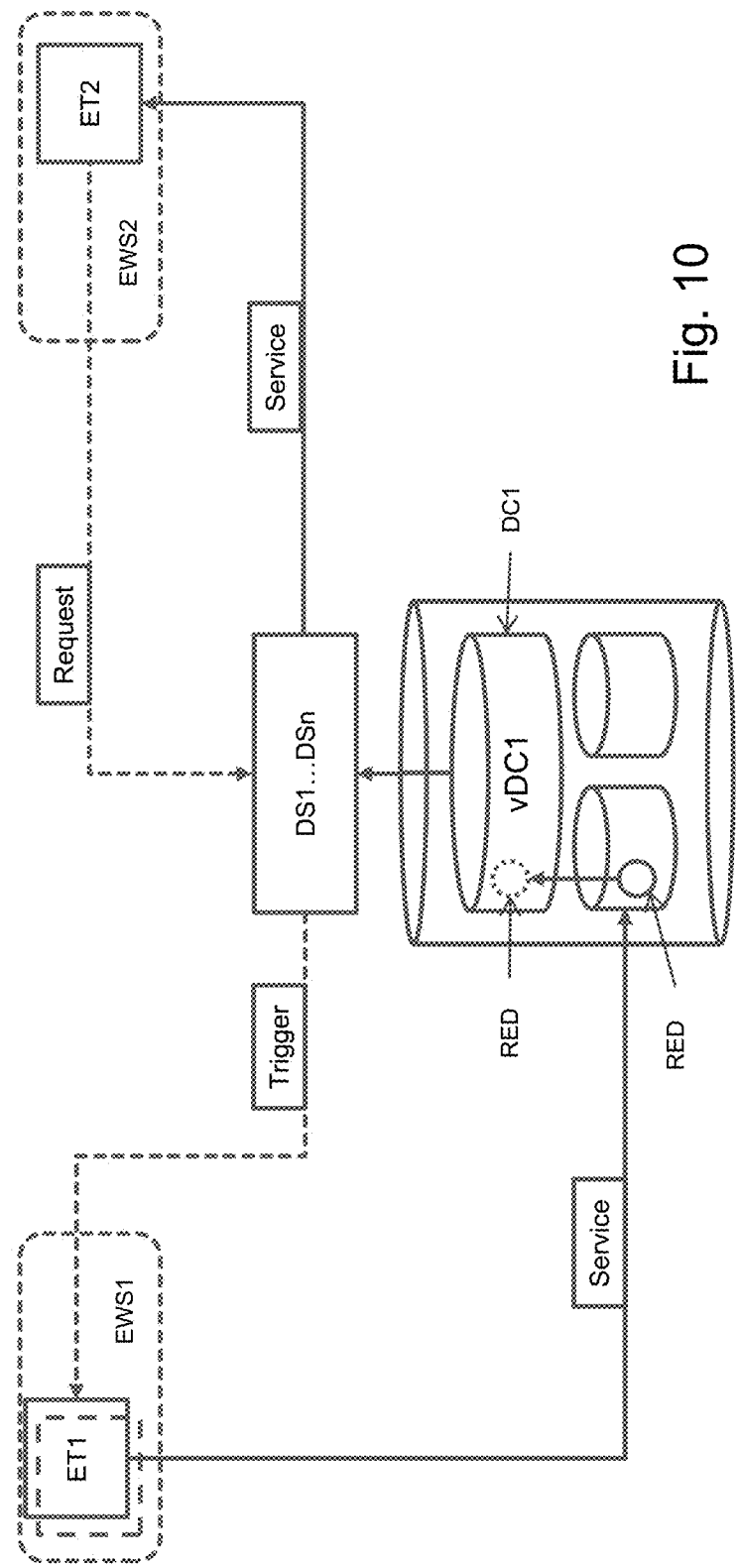

The drawings show:

FIG. 1 a diagrammatic representation of an engineering system,

FIG. 2 a diagrammatic representation of a process diagram for influencing the caching of engineering data and the start strategy for starting engineering tools, FIG. 3 a diagrammatic representation of a communication between an engineering tool and a domain service for requesting engineering data, FIG. 4 a diagrammatic representation of a communication between an engineering tool and a domain service for updating engineering data in a cache, FIG. 5 a diagrammatic representation of a process diagram for explaining the interaction of the engineering tools with system functions of the engineering system via a communication platform, FIG. 6 a diagrammatic representation of a communication between an engineering tool and a domain service for representing a caching strategy and a start strategy for the engineering tools, FIG. 7 a diagrammatic representation of an exchange of engineering data between two engineering tools installed (locally) on a workstation, FIG. 8 a diagrammatic representation of an exchange of engineering data between two engineering tools installed on different workstations, FIG. 9 a diagrammatic representation of an exchange of engineering data between two engineering tools, one of which is not in operation, and FIG. 10 a diagrammatic representation of an exchange of engineering data between two engineering tools which are installed on different workstations and of which one engineering tool is started.

FIG. 1 is a purely diagrammatic representation of an inventive engineering system ESY including a plurality of engineering tools ET1 . . . ETx which are coupled via a communication network N such as a bus system to an engineering server ESV, in order to enable collaborative engineering. In the embodiment example represented, the engineering tools ET1, ET2 are hosted in an engineering workstation EWS1, and the engineering tool ETx is hosted in an engineering workstation EWSx. The engineering workstations EWS1 . . . EWSx can each comprise a display unit DIS as well as an input unit KEY.

The engineering system ESY moreover includes a plurality of system functions SF1 . . . SFn such as, for example, a project management function, a topology function, a variable exchange function, a diagnosis function, et al., which in the embodiment example represented are installed on the engineering server ESV. Alternatively, the system functions SF1 . . . SFn can be installed in the form of one or more system tools on one or more engineering workstations EWS1 . . . EWSx or in a cloud.

The system functions SF1 . . . SFn are each classified as a domain and implemented as standard domain service DS1 . . . DSn which can be retrieved via a domain interface DI1 . . . DIn. Each domain service DS1 . . . DSn publishes a standardized data model CDM1 . . . CDMn in order to represent its domain data. The domain services DS1 . . . DSn are coupled to the communication network N and can access a system data memory SR via a collaboration module CM. The system data memory SR preferably includes a project data memory SPMR for project data ETPD1 . . . ETPDn of the engineering tools ET1 . . . ETn, which is stored in a tool-specific data format. Furthermore, the system data memory SR includes a common standardized cache CC which is divided in accordance with the domain services DS1 . . . DSn into memory domains DC1 . . . DCn for the caching of domain data DD1 . . . DDn. In each case selected standardized engineering data ET1D . . . ETnD, for example of the participating engineering tools ET1, ET2, which is associated with a domain service DS1 . . . DSn and selected for the domain, is stored in the memory domains DC1 . . . DCn. The domain services DS1 . . . DSn in each case comprise a cache management module CM1 . . . CMn, which defines the strategy of the caching and synchronization of engineering data as a function of the availability of the engineering tools ET1 . . . ETn.

In the collaboration module CM, a system project management interface SMPI with a corresponding project management service SPMS, a system data memory management tool SRMT, a central tool control server TBSV as well as a memory access control is installed. The collaboration module CM controls the engineering tools ET1 . . . ETn, the exchange of engineering data ETD1 . . . ETDn between the engineering tools ET1 . . . ETx, the domain services DS1 . . . DSn, and the memory domains DC1 . . . DCn. By means of the system project management service SPMS, system function data and engineering tool project data of the participating engineering tools are managed.

The system data memory management tool SRMT enables access to the system data memory SR for the system project management interface SPMI or any other domain service DS1 . . . DSn. The system data memory SR is the common data memory infrastructure which can be localized anywhere in the network N. In the embodiment example represented, the system memory SR is installed in the engineering server ESV.

The engineering tools ET1 . . . ETx are each coupled via a tool connector ETC1 . . . ETCx with the communication network N. The tool connector ETC1 . . . ETCx provides domain interfaces DI1 . . . DIn for each domain service DS1 . . . DSn which is to be supported. The tool connector ETC1 . . . ETCn is designed according to the invention to convert the engineering data ETD1 . . . ETDx from a tool-specific data format of the engineering tool into a standardized data format of the domain services.

Furthermore, the tool connector ETC1 . . . ETCx in each case includes a system project management interface SPMI as well as a system data memory management interface SRMI for the direct access to the project data memory SPMR.

The inventive method is based on a data management in which the data is divided into different classes which influence the caching strategy as well as the start strategy for the engineering tools.

"Class 1" data refers to data which is defined by a user, which is entirely cached, kept up to date and which is accessible without the providing engineering tool having to run in the background. This corresponds to a duplication of data in the "tool project." The data conversion between the data formats is carried out by the tool connector ETC1 . . . ETCn by converting means. However, the duplication relates only to frequently used data with a proportion of <20% of the total quantity of data.

"Class 2" data refers to data which is partially cached, wherein the providing engineering tool running in the background provides full access to all the data, if this is desired.

"Class 1 and 2" data is cached in the common standardized cache CC which is provided by the engineering system ESY.

"Class 3" data refers to data which is not cached but available via the providing engineering tool running in the background, subsequently referred to as "virtual" cache. Although the data is present, it must, however, be loaded and converted by the respective tool connector. This data category is used for less frequently used data.

"Class 2" and "Class 3" data can be determined automatically by the engineering system based on selection criteria and/or selection statistics which are explained below.

So-called "Class 0" data is not known to the engineering system and is not transformed into the standardized data model (Common Data Model). Consequently, this data can only be accessed via the specific interfaces, SRMI. "Class 1, 2 and 3" data can be accessed via the same interfaces DI1 . . . DIn, based on the standardized data model (Common Data Model), and via the "virtual" cache.

When a start of a providing engineering tool is necessary, this start can occur from anywhere in the network N; for example, it is not necessary that the providing engineering tool ET1 is installed on the workstation EWS1 from which a user and/or a requesting engineering tool requests the data. Typically, a dedicated data server is started, so that a user of a workstation is not disturbed in his work by the possible starting of an engineering tool and display of a message on a user surface.

According to the invention, the standardized data ETD1, ETD2 is organized in domains DD1, DDn, whereby the efficiency of the collaboration of the engineering tools is supported. The domain-specific organization of the system functions SF1 . . . SFn enables a reduction of the complexity and supports the reusability. In addition, the reusability of these components within each system architecture is simplified. The development time to enable the participation of the engineering tools is reduced, since the engineering tools typically participate in a subset of the domains DS1 . . . DSn. The engineering tools can increase the scope of their participation step by step, while collaboration with a first domain already exists.

From the standpoint of a user, the system functions SF1 . . . SFn implemented as domain services DS1 . . . DSn appear as an "app" on a mobile device, for example, as a small portion of a user program. These "apps" can be installed and uninstalled separately and they represent a manageable uniformity of features. The caching strategy for data and the start strategy for the engineering tools can be determined individually for each domain.

In order to reduce the amount of data to be exchanged in the engineering system ESY, it is provided according to the invention that the quantity of data is reduced by selection criteria. Here, maximum availability should be ensured.

According to the invention, the engineering system ESY comprises a filter tool FT, the function of which is represented diagrammatically in FIG. 2. The filter tool FT is designed to read at the same time the communication and the data exchange between the engineering tools and the domain services DS1 . . . DSn. The filter tool FT is configured by means of data selection criteria DSC. Since the engineering system ESY via the filter tool FT at the same time reads the exchange of engineering data ED between the engineering tools ET1 . . . ETx and the domain services DS1 . . . DSn, i.e., the data to be exchanged is known to the system, a data selection can occur based on the data selection criteria. The filtered or selected data SED is in each case cached in the caches DC1 . . . DCn.

The filter tool FT is moreover designed to generate statistics STA based on the data or messages read at the same time. This means that the content of requests between engineering tools ET1 . . . ETx, and requests between domain services DS1 . . . DSn and engineering tools ET1 . . . ETx, and the frequency of requests and optionally additional criteria are verified. For example, frequently requested data is cached in the caches DC1 . . . DCn.

The data selection can occur based on the data selection criteria DSC, based on the statistics STA, and by a combination of the data selection criteria DSC with the statistics STA.

The selection criteria DSC can be implemented via the common filter tool FT. The filter tool FT verifies requests and offers of engineering data ED. Data which is requested often should be stored.

The data selection criteria DSC can be defined by means of statistical information STI, for example, once manually at the beginning of the engineering procedure. For example, it can be known from the start that the engineering tool ETx must publish certain data which the engineering tools ETy and ETz require in each case.

Another possibility consists in using, for the definition of the data selection criteria DSC, dynamic information DYI which can be defined at any time by a user, when data from the standardized data model (common data model) is requested.

The definition of dynamic information DYI can also be used for the generation of the selection statistics STA. The generation of dynamic information DYI does not necessarily require an additional user action, since the requesting engineering tool itself can also know by itself which special criteria the data has to meet and can therefore define the criteria autonomously.

In this connection, it should be noted that data which is already connected with other data in the cache DC1 ... DCn is always "selected" and stored automatically in the cache.

The application of the statistical information STI and of the dynamic information DYI of the individual engineering tools ET1 ... ETx and the combinations thereof with stored data selection criteria DSC as well as the configuration of an engineering tool strategy TSC can influence both the caching strategy CS for the selected data SED1 ... SEDx and also the start strategy TLS for the engineering tools.

FIG. 3 is a purely schematic sequence diagram for the representation of a communication between the engineering tool ET1 and the domain service DS1 of the engineering server ESY. For a user interface ET1UI of the engineering tool ET1, a user enters a data request which relates, for example, to variables of a certain domain. The request "Request Common Data" is sent taking into consideration data selection criteria DSC via the tool connector ET1C to the corresponding domain service DS1. The data selection criteria DSC are stored in the domain service DS1. Independently thereof, the request "Request Common Data" is evaluated by the filter tool FT implemented in the communication module KM for the formation of selection statistics "Build Selection Statistics."

Alternatively, the possibility exists of sending a data request "Request Common Data" via a user interface DS1UI of the domain service DS1. This too can occur taking into consideration data selection criteria DSC. In the domain service DS1, the data selection criteria are stored "Store Selection Criteria" and evaluated for the generation of selection statistics "Build Selection Statistics."

FIG. 4 shows a communication diagram for the representation of a communication between the engineering tool ET1 and, for example, the domain service DS1 concerning the updating of the cache DC1 of the domain service DS1. Via the user interface ET1UI, after a modification of engineering data, the user enters the command "Modify Data." The engineering tool ET1 sends an update notification "Update Notification" to the domain service DS1 via the tool connector ET1C. The domain service DS1 reads the selection statistics corresponding to the request "Read Selection Statistics" and sends a request "Request Data" to the engineering tool ET1 taking into consideration selection criteria.

The engineering tool ET1 sends the selected engineering data SED via the command "Return Selected Data" to the domain service DS1, whereafter the selected data is stored in the cache DC1 associated with the domain service DS1.

From the above, it results that an update of the cache DC1 occurs based on the stored selection statistics and on user-defined data selection criteria.

FIG. 5 diagrammatically shows the engineering system according to FIG. 1 in a simplified representation. The domain service DS1 is installed together with the engineering tools ET1, ET2 on the engineering workstation EWS1.

The start of the engineering tools ET1 ... ET3 is managed via a tool broker service comprising a preferably central tool broker server TBSV which communicates with the tool broker clients TBCL1, TBCL2, TBCL3 implemented in the individual engineering tools ET1, ET2, ET3.

The engineering tools ET1, ET2, ET3 are registered via the tool broker clients TBCL with the central tool broker server TBSV which manages the statistical information STI and dynamic information DYI of the engineering tools ET1, ET2 and ET3, which is stored in the system memory SR. Furthermore, the tool broker server TBSV provides the information for starting or triggering an engineering tool via the corresponding tool connector ETC1, ETC2, ETC3 at the correct site.

Upon a data request, for example, of the engineering tool ET1 for engineering data of the engineering tool ET3 from, for example, the domain server DS1, the cache management CM1 thereof requests the tool broker server TBSV to identify the associated tool connector ETC3. After identification of the associated tool connector ETC3, the engineering tool ET3 can be started via the domain interfaces DI1 with the command "Trigger Tool Launch." The start of the engineering tool is always executed in a domain context, for example, a data request of a domain in the background is the initiator for activities of the engineering tools.

According to the invention, a resynchronization with the system memory SR occurs. First, the engineering tools ET1 ... ETx are registered for the common data in which they are interested. The engineering tools ET1 ... ETx or domain services DS1 ... DSn which are not yet ready for an exchange of data enable only an exclusive modification, i.e., one user at a time. This results from the fact that the engineering tools ET1 ... ETx and the domain services DS1 ... DSn are coupled to the one central data memory SR.

Modifications of data in a project such as, for example, a robot cell can have influences on other participating projects. For example, when, after separation of the engineering server, an engineering tool is connected again to said engineering server, this engineering tool requests changes of data which have occurred in the meantime. These changes are collected in a pending action list. Many of the changes in the pending action list can be processed by the re-connected engineering tool itself. However, some of the changes require a user intervention. As long as the actions listed in the pending action list are not carried out, the system remains inconsistent. However, the integrity is still maintained. Allowing a temporary inconsistency is an essential aspect of the inventive method.

FIG. 6 shows an additional sequence diagram for representing a communication between engineering tools ET1, ET2 and, for example, the domain service DS1. In the example represented, the engineering tool ET1 sends the request "Request Data" via the tool connector ETC1 to the domain service DS1. The data cache DC1 is associated with the domain service DS1.

Via a message "Provide Data" the data of the engineering tool ET2 is provided to the engineering tool ET1 via the tool connector ETC1. The engineering tool connectors ETC1, ETC2 are in each case associated with the engineering tools ET1, ET2 and process the data exchange from and to the cache DC1. The request for data always occurs via the same domain interface, independently of the caching strategy. When the data is not available, the providing engineering tools are requested to operate the cache DC1.

Optionally, the possibility exists that the domain service DS1 fills the cache during an intermediate sequence "Optional Fill Cache". Then, the domain service DS1 sends a start signal "Launch Tool" to the engineering tool ET2, whereby said engineering tool is started. Next, the data requested is loaded from the engineering tool ET2 via the tool connector ETC2 into the cache CB1.

Before the collaboration between the engineering tools ET1 ... ETx is started, both the engineering server ESV and the engineering tools ET1 ... ETx have to be prepared to apply the above-mentioned and explained caching strategy and start strategy of the engineering tools.

First, the data selection criteria DSC have to be defined. They are defined and stored in the common standardized memory CR.

With each installation of an engineering server ESV on a data processing system, hardware information and engineering tool information are registered. Here, statistical hardware information and statistical engineering tool information are stored in the common data memory CR.

Then, data selection attributes are configured in the engineering tool. Subsequently, the engineering tools are ready to generate the attributes of the data, which are processed by a user.

In an additional step, the start strategy for engineering tools is configured. The configuration includes the formulation of rules which influence the caching and the start strategy of the engineering tools, based in particular on statistical data/information STI of the workstations, statistical data/information STI of the engineering tools, dynamic data/information DYI of the workstations, dynamic data/information DYI of the engineering tools, and data selection criteria.

Subsequently, the engineering tools and the common data memory SR of the engineering server ESV are ready to start.

The engineering method includes an initialization phase, a strategy selection phase, and an execution phase in the form of an execution loop.

The initialization phase includes the determination of installation sites for engineering tools, the determination of hardware information of the workstations, the determination of the load of the workstations, the determination of a start status of the engineering tools, the determination of an operating status of the engineering tools, the reading in of the start strategy configuration of the engineering tools, and the determination of the data selection criteria.

The strategy selection phase includes the determination of the site of the engineering tools, the determination of the start strategy of the engineering tools, and the determination of the caching strategy of the individual data classes.

The execution phase first includes the verification of the size of the available cache. If the size of the cache is in agreement with the data to be stored, a complete updating of the cache occurs. Then the start strategy of the engineering tools is updated.

If, at the time of the verification of the cache, it is established that the cache is limited, then only a selective updating of the cache occurs. Then the start strategy of the engineering tool is updated.

If no cache is available, then no updating of the cache occurs, but instead an immediate management of the start strategy of the engineering tools occurs.

FIG. 7-10 diagrammatically show a method for data exchange between engineering tools ET1, ET2 depending on the class of the data to be exchanged and depending on the location of the engineering tools ET1, ET2.

FIG. 7 diagrammatically shows the exchange of engineering data ED between an engineering tool ET1 and an engineering tool ET2, which are installed on the same workstation EWS1. The engineering tool ET2 requests, via the request "Request," from the corresponding domain service, in the present case, DS1 "Class 2" engineering data ED which is processed by the engineering tool ET1. The domain service DS1 triggers the engineering tool ET1 via the message "Trigger" to update the cache DC1 in the case in which the cache DC1 does not contain the requested engineering data EV.

The strategy represented in FIG. 7 can be used, for example, in the configuration of a variable exchange. The engineering tool ET1 provides, for example, a variable EV which is to be acquired by the engineering tool ET2. Since, no suitable variable EV is visible in the engineering data ET1D of the engineering tool ET1 in the cache DC1 associated with the domain DS1, the engineering tool ET1 is started by the domain service DS1 in order to obtain more variables EV from which a selection can occur or a new variable can be generated. The selected or newly created variable EV is then added to the cache DC1.

FIG. 8 shows an example of a data exchange between two engineering tools ET1, ET2 which are installed on separate workstations WS1, WS2. Via the command "Request," the engineering tool ET2 requests "Class 2" engineering data EV will be processed by the engineering tool. With the message "Trigger," the domain service DS1 triggers the engineering tool ET1 to load engineering data EV into the cache DC1, i.e., to update said cache. Via the domain service DS1, the engineering tool data EV is made available to the engineering tool ET2.

In this connection, it should be noted that the service "Trigger" of the domain service DS1 does not necessarily imply a central server with a corresponding tool broker. If a tool connector ETC1, ETC2 of an engineering tool ET1, ET2 is designed to manage instances of engineering tools anywhere in a network, then the tool connector can start an engineering tool anywhere in the network.

Consequently, accessing an instance of an engineering tool depends basically on how the tool connectors are designed. But a common tool broker service for the engineering system architecture is an option and is not absolutely necessary.

FIG. 9 schematically shows the exchange of data, in particular "Class 1" data, between engineering tools ET1, ET2 installed in different workstations EWS1, EWS2. In the represented embodiment example, the engineering tool ET1 is not in operation, but has initiated beforehand the data storage of engineering data ET1d into the cache CB1. Via the command "Request," the engineering tool ET2 requests engineering data RED which is processed by the engineering tool ET1. Via the domain service DS1, the engineering data RED of the engineering tool ET1 is provided to the engineering tool ET2 from the cache DC1.

FIG. 10 schematically shows the exchange of engineering data RED between the engineering tool ET1 and ET2, wherein the engineering tools are installed on separate workstations EWS1, EWS2 and the engineering tool ET1 is not in operation. Via the command "Request," the engineering tool ET2 requests engineering data RED which is processed by the engineering tool ET1.

Via the domain service DS1, the engineering tool ET1 in the workstation EWS1 is triggered and put in operation. The engineering tool ET1 stores the requested engineering data RED in the "virtual" cache VDC1 from which the engineering data RED is provided to the engineering tool via the domain service DS1.

The invention claimed is:

1. A method for the exchange of engineering data between independent engineering tools of an engineering system,
    wherein engineering data of each of the engineering tools, which is associated with a project that includes a production system, a switching system, and a robot cell, is stored in a tool-specific data format in a data memory associated with the engineering tool,
    wherein user-selected engineering data of the engineering tools, which is associated with a system function that includes a project management function, a topology management function, a variable exchange function, and a diagnosis function, and which is of interest for at least an additional one of the engineering tools, is converted by means of a converting unit into a standardized data format and is stored in a standardized common data memory, wherein changes of the selected engineering data of the individual engineering tools, which is associated with the system function, are continuously cached in the standardized common data memory and are read as needed at any time by one of the engineering tools, and wherein the engineering data relating to a project, and/or the data of an engineering tool relating to the system function, after separation of the engineering tool, is stored in the common data memory, and wherein, for temporary access to all the project-associated engineering data by a requesting engineering tool, a start of the separated engineering tools providing the data, or a start of a data server providing the data, is carried out.

2. The method according to claim 1, wherein the caching is carried out according to a caching strategy, wherein the engineering data are cached in accordance with a data classification, comprising:

Class 1 data which is cached and updated, so that it can be accessed at any time without the associated engineering tool being in operation, Class 2 data which is partially cached, wherein the associated engineering tool ensures full access to all the data associated with a project, Class 3 data which is not cached, but available via a providing engineering tool, and Class 0 data which is not transformed into a common data model and which is read exclusively via a specific interface of the engineering tool.

3. The method according to claim 1, wherein the system functions of the engineering system is provided in a form of variable management, diagnosis management, firmware management, application management, function management, network management, hardware, or configuration management, as standardized common domain services, and wherein the engineering tools access the common standardized engineering data via the domain services.

4. The method according to claim 3, wherein the domain services in each case provide a common standardized data model for the representation of their domain data.

5. The method according to claim 1, wherein the caching of selected engineering data and/or the start of one of the engineering tools is carried out taking into consideration data selection criteria, selection statistics, statistical information, and/or dynamic information.

6. The method according to claim 5, wherein the data selection criteria are specified by a user, and wherein the selection statistics are established by reading the requested engineering data at the same time.

7. The method according to claim 3, wherein the engineering tools communicate via the domain services with one another and with the common standardized data memory.

8. The method according to claim 1, wherein the converting of the engineering data is carried out in each individual engineering tool by means of a tool connector.

9. An engineering system for the exchange of engineering data between independent engineering tools of the engineering system, wherein engineering data of each of the engineering tools, which is associated with a project that includes a production system, a switching system, and a robot cell, is stored in a tool-specific data format in a data memory associated with the engineering tool, and wherein user-selected engineering data of the engineering tools, which is associated with a system function that includes a project management function, a topology management function, a variable exchange function, and a diagnosis function and which is of interest for at least an additional one of the engineering tools, is converted by means of a converting unit into a standardized data format and is stored in a standardized common data memory, wherein the system functions is designed as a domain service, with a common standardized data model, wherein changes of the selected engineering data of the individual engineering tools, which is associated with the system function, are continuously cached by means of the domain services in the standardized common data memory and can be read as needed at any time by one of the engineering tools, and wherein the engineering data relating to a project, and/or the data of an engineering tool relating to a system function, after separation of the engineering tool, is stored in the common data memory, and wherein, for a temporary access to all the engineering data associated with the project by a requesting engineering tool, a start of the separated engineering tool providing the data, or of a data service providing the data, is carried out by means of a start mechanism.

10. The engineering system according to claim 9, wherein instances of the engineering tools are installed on an engineering server, and wherein the instance of the engineering tool is started on the engineering server in order to access all the data of this engineering tool.

* * * * *